US012621949B2

(12) United States Patent
Bassman et al.

(10) Patent No.: US 12,621,949 B2
(45) Date of Patent: May 5, 2026

(54) SYSTEMS AND METHODS FOR ASSEMBLING DAUGHTER CARD TO HOST CARD

(71) Applicant: Dell Products L.P., Round Rock, TX (US)

(72) Inventors: Robert G. Bassman, Dalton, MA (US); Gabriel J. Braun, Pflugerville, TX (US); Eduardo Escamilla, Round Rock, TX (US); Michael Lo, Round Rock, TX (US); Jeffrey Patti, Georgetown, TX (US); James Utz, Georgetown, TX (US); Yenlin Wang, Taipei (TW)

(73) Assignee: Dell Products L.P., Round Rock, TX (US)

( * ) Notice: Subject to any disclaimer, the term of this patent is extended or adjusted under 35 U.S.C. 154(b) by 152 days.

(21) Appl. No.: 18/412,085

(22) Filed: Jan. 12, 2024

(65) Prior Publication Data

US 2025/0234473 A1     Jul. 17, 2025

(51) Int. Cl.
H05K 7/14       (2006.01)
G06F 1/183     (2026.01)

(52) U.S. Cl.
CPC ........... H05K 7/1461 (2013.01); G06F 1/183 (2013.01); H05K 7/1407 (2013.01)

(58) Field of Classification Search
CPC ................ H05K 7/1461; H05K 7/1407; G06F 1/183–185
USPC ......................................... 361/801, 803, 759
See application file for complete search history.

(56) References Cited

U.S. PATENT DOCUMENTS

| | | | | |
|---|---|---|---|---|
| 4,952,107 A | * | 8/1990 | Dupree | F16B 5/0208 |
| | | | | 411/103 |
| 5,268,820 A | * | 12/1993 | Tseng | H01R 12/7029 |
| | | | | 439/74 |
| 6,215,727 B1 | * | 4/2001 | Parson | G11C 7/22 |
| | | | | 365/230.09 |
| 6,424,538 B1 | * | 7/2002 | Paquin | H05K 7/142 |
| | | | | 361/752 |
| 2003/0230429 A1 | * | 12/2003 | Chen | H05K 7/142 |
| | | | | 174/262 |

(Continued)

FOREIGN PATENT DOCUMENTS

| | | | | | |
|---|---|---|---|---|---|
| TW | 201517753 A | * | 5/2015 | | H05K 7/12 |

*Primary Examiner* — Hung S. Bui
(74) *Attorney, Agent, or Firm* — Jackson Walker L.L.P.

(57)          ABSTRACT

An information handling system may include a motherboard and an information handling resource mechanically and electrically coupled to the motherboard. The information handling resource may include a circuit board, a connector mounted to a surface of the circuit board and configured to electrically couple to a corresponding connector mounted to a surface of a second circuit board of a second information handling resource, a first standoff extending from a surface of the circuit board, and a second standoff extending from the surface and arranged relative to the first standoff such that the first standoff and the second standoff are configured to mechanically engage with engagement features of the second information handling resource to define an axis of pivot between the circuit board and the second circuit board to align the connector to the corresponding connector.

13 Claims, 6 Drawing Sheets

(56)                    References Cited

U.S. PATENT DOCUMENTS

2005/0287838 A1 *  12/2005  Boudreau  ............. H05K 7/142
                                                     439/74
2010/0188828 A1 *   7/2010  Takao  ............... H01R 12/7017
                                                     361/759
2011/0294309 A1 *  12/2011  Chen  ....................... H04L 49/45
                                                     439/65
2013/0058054 A1 *   3/2013  Zhou  ....................... G06F 1/185
                                                     361/748

\* cited by examiner

SYSTEMS AND METHODS FOR ASSEMBLING DAUGHTER CARD TO HOST CARD

TECHNICAL FIELD

The present disclosure relates in general to information handling systems, and more particularly to systems and methods for assembling a daughter card to a host card for an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems utilize a variety of circuit boards to implement their functionality. For example, a motherboard, the main circuit board of an information handling system, may have a circuit board referred to as a host card electrically and mechanically coupled to the motherboard. The host card may in turn have another circuit board referred to as a daughter card electrically and mechanically coupled to the host card. Accordingly, the host card may include a connector for electrically coupling to a corresponding connector of the motherboard, and may include another connector for electrically coupling to a corresponding connector of the daughter card.

In some instances, a daughter card may comprise an "attic card" configured to be oriented in parallel with the host card when the two are coupled together. Thus, in such instances, each of the host card and attic card may have connectors mounted to the surfaces thereof for electrically coupling to one another, wherein in some embodiments, the connectors are blindly mated to one another. Existing approaches for mechanically coupling an attic card to a host card have included the use of a plurality of (e.g., four) fixed screws threaded through the host card and the attic card and/or plastic push pins snaps. Such approaches may have numerous disadvantages, included difficulty of assembly and disassembly and difficulty in alignment of connectors to one another.

SUMMARY

In accordance with the teachings of the present disclosure, the disadvantages and problems associated with existing approaches to mechanically and electrically coupling a host card to a daughter card may be reduced or eliminated.

In accordance with embodiments of the present disclosure, an information handling system may include a motherboard and an information handling resource mechanically and electrically coupled to the motherboard. The information handling resource may include a circuit board, a connector mounted to a surface of the circuit board and configured to electrically couple to a corresponding connector mounted to a surface of a second circuit board of a second information handling resource, a first standoff extending from a surface of the circuit board, and a second standoff extending from the surface and arranged relative to the first standoff such that the first standoff and the second standoff are configured to mechanically engage with engagement features of the second information handling resource to define an axis of pivot between the circuit board and the second circuit board to align the connector to the corresponding connector.

In accordance with these and other embodiments of the present disclosure, an information handling resource may include a circuit board, a connector mounted to a surface of the circuit board and configured to electrically couple to a corresponding connector mounted to a surface of a second circuit board of a second information handling resource, a first standoff extending from a surface of the circuit board, and a second standoff extending from the surface and arranged relative to the first standoff such that the first standoff and the second standoff are configured to mechanically engage with engagement features of the second information handling resource to define an axis of pivot between the circuit board and the second circuit board to align the connector to the corresponding connector.

In accordance with these and other embodiments of the present disclosure, an information handling resource may include a circuit board, a connector mounted to a surface of the circuit board and configured to electrically couple to a corresponding connector mounted to a surface of a second circuit board of a second information handling resource, a first standoff engagement feature formed in an edge of the circuit board, and a second standoff engagement feature formed in the edge of the circuit board such that the first standoff engagement feature and the second standoff engagement feature are configured to mechanically engage respectively to a first standoff and a second standoff extending from a surface of the second circuit board to define an axis of pivot between the circuit board and the second circuit board to align the connector to the corresponding connector.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
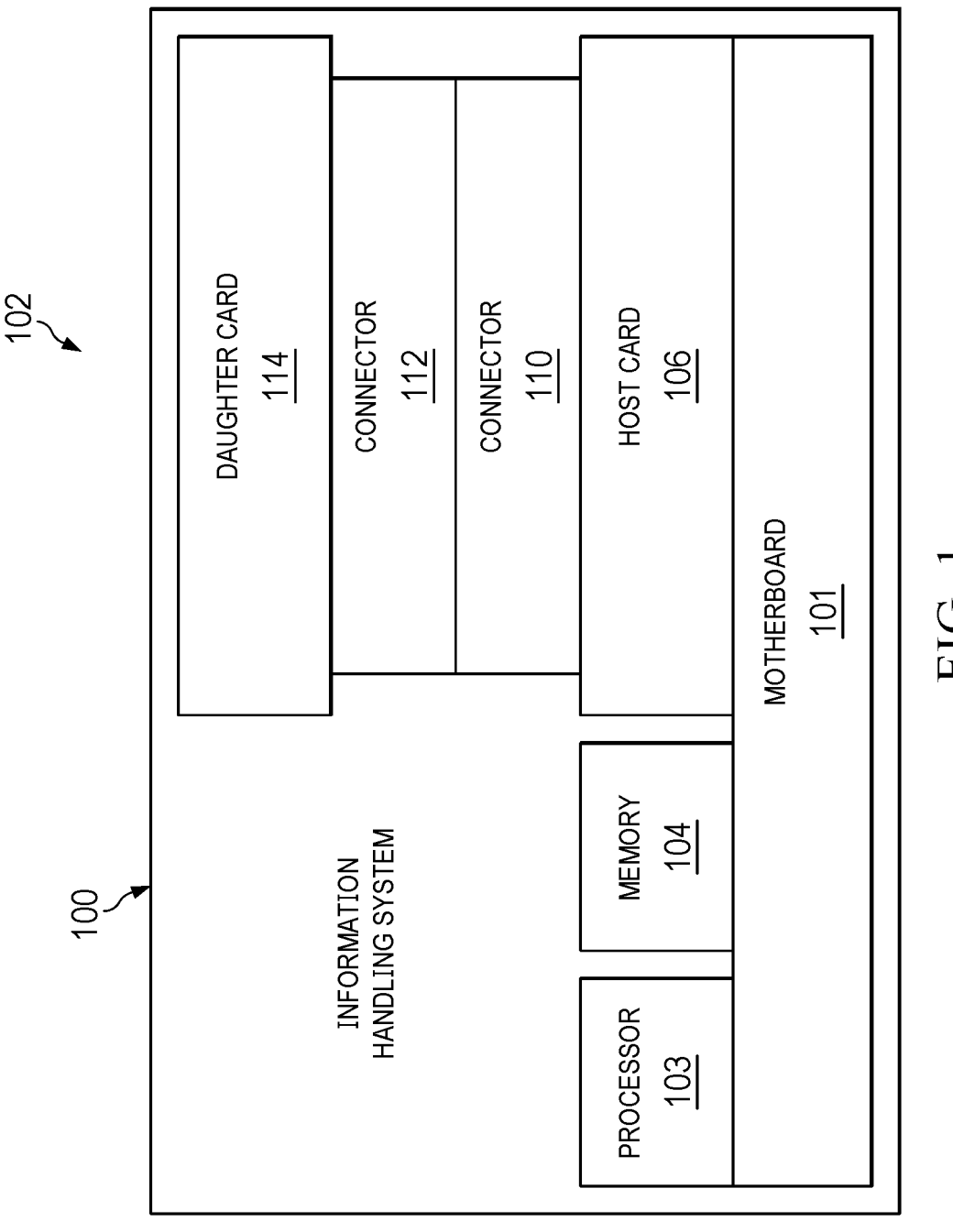
FIG. 1 illustrates a block diagram of selected components of an example information handling system, in accordance with embodiments of the present disclosure.

Preferred embodiments and their advantages are best understood by reference to FIGS. 1-6 wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and vary in size, shape, performance, functionality, and price. The information handling system may include memory, one or more processing resources such as a central processing unit ("CPU"), microcontroller, or hardware or software control logic. Additional components of the information handling system may include one or more devices, storage one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs), etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a block diagram of selected components of an example information handling system 102. In some embodiments, information handling system 102 may comprise a server. In other embodiments, information handling system 102 may comprise networking equipment for facilitating communication over a communication network. In yet other embodiments, information handling system 102 may comprise a personal computer, such as a laptop, notebook, or desktop computer.

As shown in FIG. 1, information handling system 102 may include a chassis 100 that houses a motherboard 101, a processor 103 coupled to motherboard 101, a memory 104 coupled to motherboard 101, a host card 106 mechanically and electrically coupled to motherboard 101, a connector 110 mechanically coupled to host card 106, and a daughter card 114 mechanically and electrically coupled to host card 106 via a connector 112 mechanically coupled to daughter card 114.

Chassis 100 may include any suitable housing or enclosure configured to house the various components of information handling system 102, and may be constructed from metal, plastic, and/or any other suitable material.

Motherboard 101 may comprise a circuit board configured to provide structural support for one or more information handling resources of information handling system 102 and/or electrically couple one or more of such information handling resources to each other and/or to other electric or electronic components external to information handling system 102.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in a storage resource, memory system 104, and/or another component of information handling system 102.

Memory 104 may be communicatively coupled to processor 103 and may comprise any system, device, or apparatus operable to retain program instructions or data for a period of time (e.g., computer-readable media). Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. In particular embodiments, memory 104 may comprise dynamic random access memory (DRAM).

A host card 106 may comprise a circuit board configured to couple to motherboard 101 in order to provide specific functionality for information handling system 102. Host card 106 may be coupled to motherboard 101 via an edge connector (not explicitly shown in FIG. 1) that mechanically and electrically couples to a corresponding receptacle connector of motherboard 101 (not explicitly shown in FIG. 1).

Connector 110 may comprise any system, device, or apparatus fixedly mounted relative to host card 106 and may be constructed to mechanically and electrically couple to corresponding connector 112 of daughter card 114 (which may in some embodiments be an optional feature of information handling system 102). In some embodiments, connector 112 may be coupled to connector 110 in a "blind mate" manner.

Daughter card 114 may comprise a circuit board configured to couple to host card 106 in order to provide specific functionality for information handling system 102. In some embodiments, daughter card 114 may comprise an attic card configured to be coupled to host card 106 in a manner such that circuit board surfaces of host card 106 and daughter card 114 are substantially similar to one another.

In addition to motherboard 101, processor 103, memory 104, host card 10, connector 110, connector 112, and daughter card 114, information handling system 102 may include one or more other information handling resources.

Figure 2:
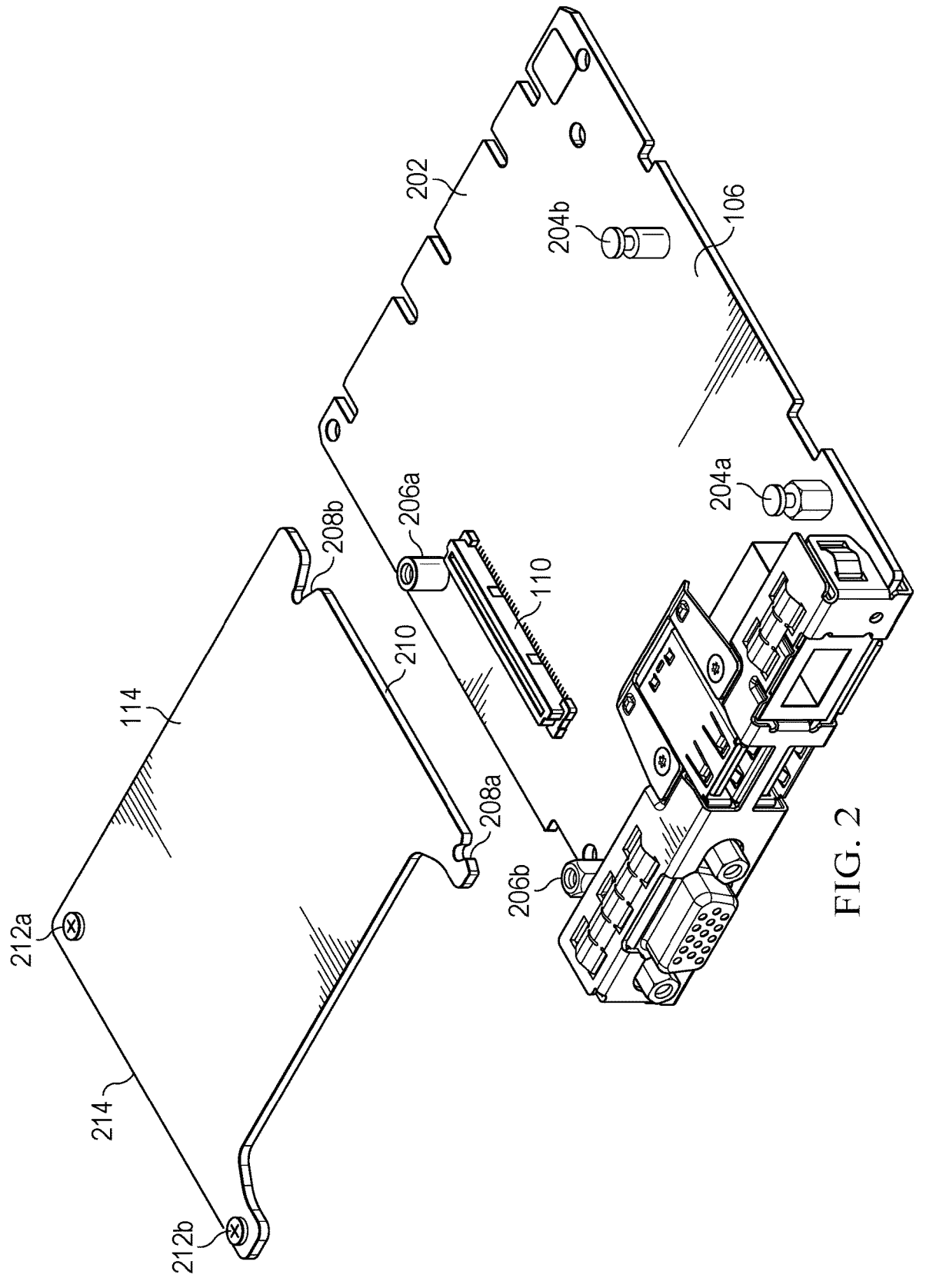
FIG. 2 illustrates a perspective view of an example host card and an example daughter card disassembled from one another, in accordance with embodiments of the present disclosure.

FIG. 2 illustrates a perspective view of host card 106 and daughter card 114 disassembled from one another, in accordance with embodiments of the present disclosure. As shown in FIG. 2, host card 106 may have connector 110 mounted to a surface 202 thereof. Further, host card 106 may have standoffs 204a and 204b (which may individually be referred to as "a standoff 204" and collectively as "standoffs 204") mounted to surface 202 such that an axis of each standoff 204 is perpendicular to surface 202, and threaded inserts 206a and 206b (which may individually referred to as "a threaded insert 206" and collectively as "threaded inserts 206") mounted to surface 202 such that an axis of each threaded insert 206 is perpendicular to surface 202. As shown in FIG. 2, standoffs 204 and threaded inserts 206 may be mounted to surface 202 near edges of host card 106.

As also shown in FIG. 2, daughter card 114 may have standoff engagement features 208a and 208b (which may individually referred to as "an engagement feature 208" and collectively as "engagement features 208") formed in an edge 210 of daughter card 114 and configured to mechanically couple respectively to standoffs 204a and 204b, as described in greater detail below. Further, daughter card 114 may also include captive screws 212a and 212b (which may individually referred to as "a captive screw 212" and collectively as "captive screws 212") mechanically retained within daughter card 114 at an edge 214 of daughter card 114 opposite of edge 210. Daughter card 114 may also include connector 112 mounted to a surface thereof, but connector 112 is not visible in the perspective of FIG. 2.

Figure 3:
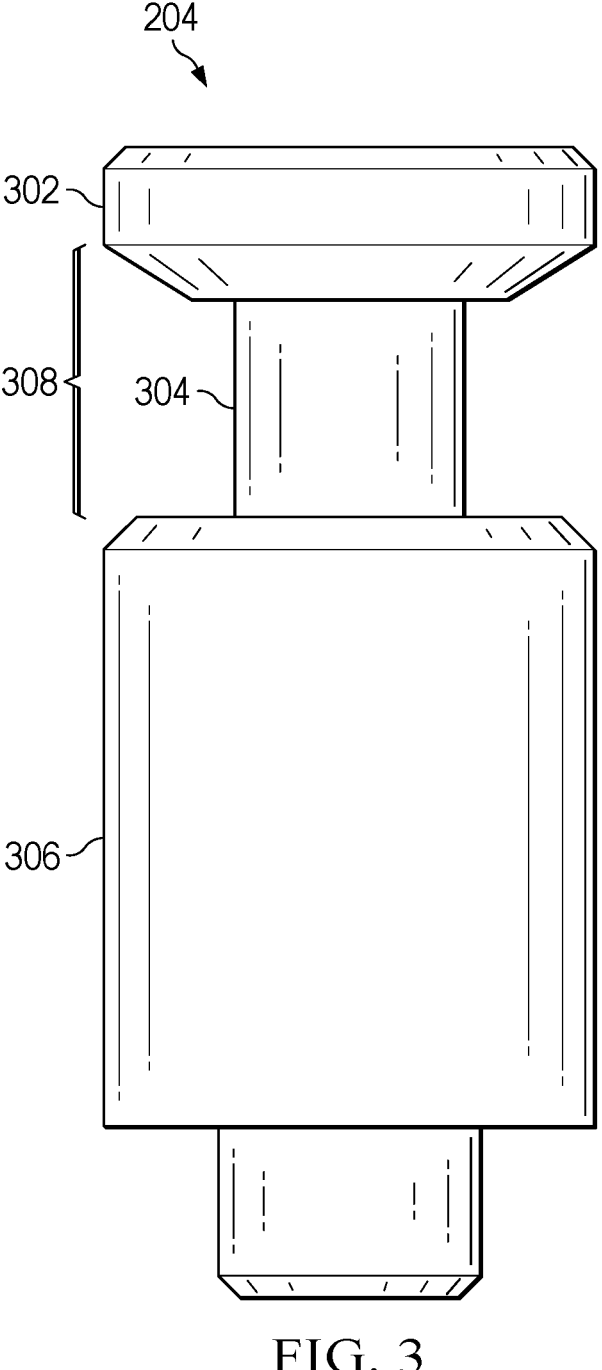
FIG. 3 illustrates a perspective view of an example standoff, in accordance with embodiments of the present disclosure.

FIG. 3 illustrates a perspective view of an example standoff 204, in accordance with embodiments of the present disclosure. As shown in FIG. 3, standoff 204 may include a generally circular-shaped head 302 tapering to a cylindrical shaft 304 such that head 302 and shaft 304 are concentric. A cylindrically-shaped barrel 306 concentric with shaft 304 and having a larger diameter than shaft 304 may be formed around a portion of shaft 304, such that shaft 304 comprises an engagement region 308 on the surface of shaft 304 located between head 302 and barrel 306. The axis of shaft 304 may be generally perpendicular to surface 202. As described in greater detail below, when mechanically coupling daughter card 114 to host card 106, a user may mechanically engage standoff engagement features 208a and 208b with engagement regions 308 of standoffs 204a and 204b, respectively, creating a pivot for aligning connector 112 to connector 110.

Figure 4:
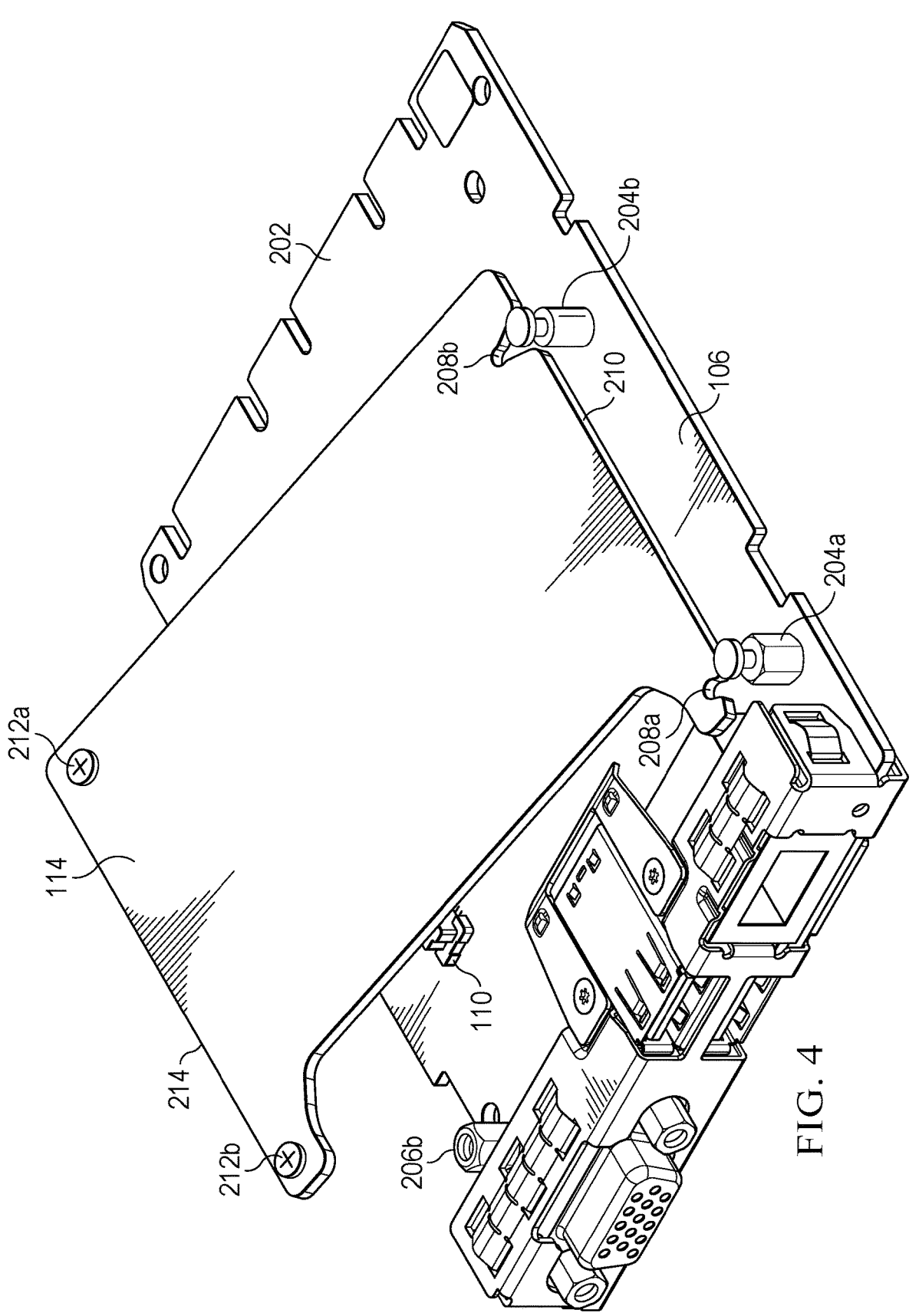
FIG. 4 illustrates a perspective view of a step in mechanically coupling an example daughter card to an example host card, in accordance with embodiments of the present disclosure.

FIG. 4 illustrates a perspective view of a step in mechanically coupling daughter card 114 to host card 106, in accordance with embodiments of the present disclosure. As shown in FIG. 4, to mechanically couple daughter card 114 to host card 106, a user may manipulate daughter card 114 such that standoff engagement features 208a and 208b mechanically engage with engagement regions 308 of standoffs 204a and 204b, respectively, creating a pivot for aligning connector 112 to connector 110, such pivot having an axis proximate to edge 210. Such engagement may align connector 110 and 112 such that the user may utilize such pivot to lower edge 214 towards host card 106 to mechanically and electrically couple connector 112 to connector 110, as shown in FIGS. 5 and 6.

Figure 5:
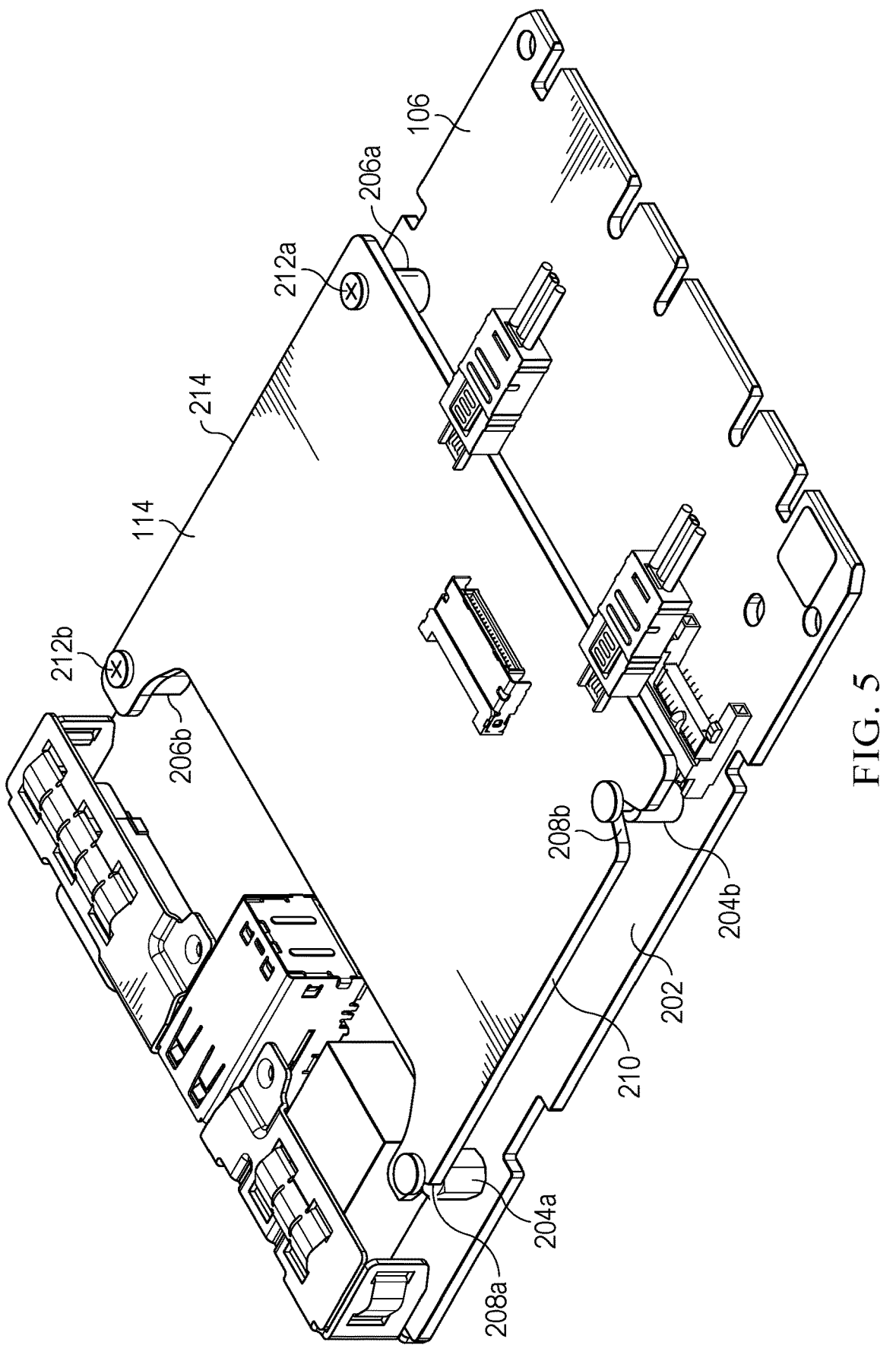
FIG. 5 illustrates a perspective view of an example daughter card mechanically and electrically coupled to an example host card, in accordance with embodiments of the present disclosure.
Figure 6:
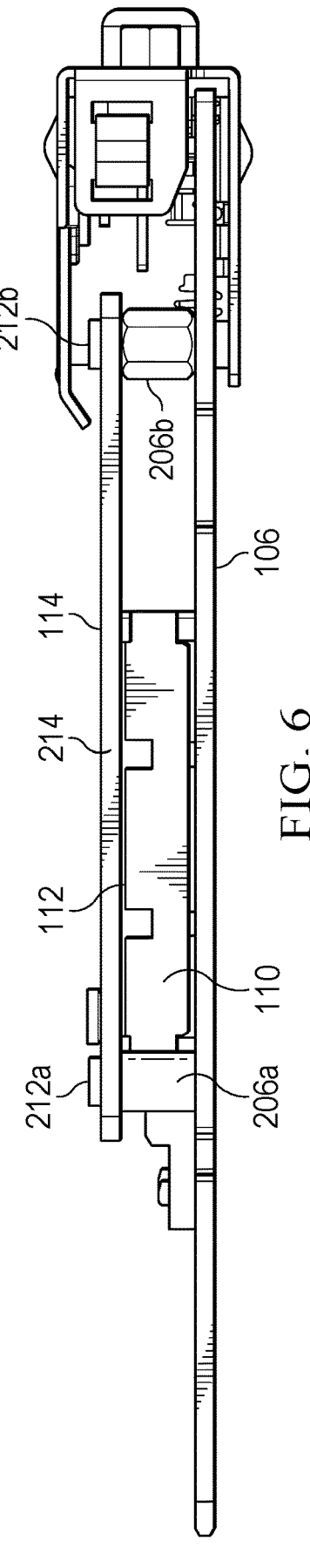
FIG. 6 illustrates a side elevation view of an example daughter card mechanically and electrically coupled to a host card, in accordance with embodiments of the present disclosure.

FIG. 5 illustrates a perspective view of daughter card 114 mechanically and electrically coupled to a host card 106, in accordance with embodiments of the present disclosure. FIG. 6 illustrates a side elevation view of daughter card 114 mechanically and electrically coupled to host card 106, in accordance with embodiments of the present disclosure.

After a user has lowered edge 214 towards host card 106 to mechanically and electrically couple connector 112 to connector 110, ad described above, the user may then (e.g., using an appropriate tool) mechanically engage threads of captive screws 212a and 212b to corresponding threads of threaded inserts 206a and 206b, respectively, in order to retain mechanical coupling between host card 106 and daughter card 114.

Although a particular arrangement of standoffs 204, threaded inserts 206, and standoff engagement features 208 is shown in the figures, it is understood that other suitable orientations of standoffs 204, threaded inserts 206, and standoff engagement features 208 may be utilized. For example, in some embodiments, the locations of standoff 204b and threaded insert 206b may be swapped, and in such embodiments, standoff engagement features 208 may be formed in an edge of daughter card 114 perpendicular to edge 210 and 214.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112 (f) unless the words "means for" or "step for" are explicitly used in the particular claim.

What is claimed is:

1. An information handling system comprising:
a motherboard; and
an information handling resource mechanically and electrically coupled to the motherboard and comprising:
a circuit board;
a connector mounted to a surface of the circuit board and configured to electrically couple to a corresponding connector mounted to a surface of a second circuit board of a second information handling resource;
a first standoff extending from a surface of the circuit board; and
a second standoff extending from the surface and arranged relative to the first standoff such that the first standoff and the second standoff are configured to mechanically engage with engagement features of the second information handling resource to define an axis of pivot between the circuit board and the second circuit board to align the connector to the corresponding connector.

2. The information handling system of claim 1, the information handling resource further comprising a threaded insert configured to mechanically couple to a captive screw maintained within the second circuit board.

3. The information handling system of claim 1, wherein at least one of the first standoff and the second standoff comprises:
a shaft extending from the surface of the circuit board;
a head coupled to the end of the shaft; and
a barrel formed around a portion of the shaft, such that the shaft includes an engagement region on a surface of the shaft located between the head and the barrel and configured to mechanically engage with an engagement feature of the second information handling resource to define the axis of pivot.

4. The information handling system of claim 3, wherein:
the shaft is cylindrical;
the head is circular and concentric with the shaft; and
the barrel is concentric with and has a diameter greater than the shaft.

5. The information handling system of claim 4, wherein an axis of the shaft is substantially perpendicular with the surface of the circuit board.

6. An information handling resource comprising:
a circuit board;
a connector mounted to a surface of the circuit board and configured to electrically couple to a corresponding connector mounted to a surface of a second circuit board of a second information handling resource;
a first standoff extending from a surface of the circuit board; and
a second standoff extending from the surface and arranged relative to the first standoff such that the first standoff and the second standoff are configured to mechanically engage with engagement features of the second information handling resource to define an axis of pivot between the circuit board and the second circuit board to align the connector to the corresponding connector.

7. The information handling system of claim 6, the information handling resource further comprising a threaded insert configured to mechanically couple to a captive screw maintained within the second circuit board.

8. The information handling system of claim 6, wherein at least one of the first standoff and the second standoff comprises:
a shaft extending from the surface of the circuit board;
a head coupled to the end of the shaft; and
a barrel formed around a portion of the shaft, such that the shaft includes an engagement region on a surface of the shaft located between the head and the barrel and configured to mechanically engage with an engagement feature of the second information handling resource to define the axis of pivot.

9. The information handling system of claim 8, wherein:
the shaft is cylindrical;
the head is circular and concentric with the shaft; and
the barrel is concentric with and has a diameter greater than the shaft.

10. The information handling system of claim 9, wherein an axis of the shaft is substantially perpendicular with the surface of the circuit board.

11. An information handling resource comprising:
a circuit board;
a connector mounted to a surface of the circuit board and configured to electrically couple to a corresponding connector mounted to a surface of a second circuit board of a second information handling resource;

US 12,621,949 B2

9 a first standoff engagement feature formed in an edge of the circuit board; and a second standoff engagement feature formed in the edge of the circuit board such that the first standoff engagement feature and the second standoff engagement feature are configured to mechanically engage respectively to a first standoff and a second standoff extending from a surface of the second circuit board to define an axis of pivot between the circuit board and the second circuit board to align the connector to the corresponding connector.

12. The information handling resource of claim 11, the information handling resource further comprising a captive screw maintained within the circuit board configured to mechanically couple to a threaded insert of the second information handling resource.

13. The information handling resource of claim 12, the captive screw located proximate to a second edge of the circuit board opposite from the edge.

* * * * *

10